US 11,574,934 B2

(12) United States Patent
Zhang et al.

(10) Patent No.: US 11,574,934 B2
(45) Date of Patent: Feb. 7, 2023

(54) ARRAY SUBSTRATE, METHOD FOR MANUFACTURING THE SAME, AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Jie Zhang, Beijing (CN); Pan Guo, Beijing (CN); Wei Li, Beijing (CN); Jun Fan, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 1262 days.

(21) Appl. No.: 16/066,162

(22) PCT Filed: Dec. 18, 2017

(86) PCT No.: PCT/CN2017/116842
§ 371 (c)(1),
(2) Date: Jun. 26, 2018

(87) PCT Pub. No.: WO2018/205620
PCT Pub. Date: Nov. 15, 2018

(65) Prior Publication Data
US 2021/0167097 A1    Jun. 3, 2021

(30) Foreign Application Priority Data

May 11, 2017    (CN) .......................... 201710331020.0

(51) Int. Cl.
*H01L 27/00* (2006.01)
*H01L 27/12* (2006.01)

(52) U.S. Cl.
CPC ........ *H01L 27/1237* (2013.01); *H01L 27/127* (2013.01)

(58) Field of Classification Search
CPC . H01L 27/1237; H01L 27/127; H01L 27/323; H01L 27/324; H01L 27/124;
(Continued)

(56) References Cited

U.S. PATENT DOCUMENTS 6,697,136 B1    2/2004    Yasukawa
9,647,009 B1    5/2017    Zhao et al.
(Continued)

FOREIGN PATENT DOCUMENTS

| CN | 103904086 A | 7/2014 |
| CN | 203720505 U | 7/2014 |

(Continued)

OTHER PUBLICATIONS

First Office Action for Chinese Application No. 201710331020.0, dated May 5, 2019, 13 Pages.
(Continued)

*Primary Examiner* — Nikolay K Yushin
(74) *Attorney, Agent, or Firm* — Brooks Kushman P.C.

(57) ABSTRACT

The present disclosure provides in some embodiments an array substrate, a method for manufacturing the same, and a display device. The array substrate includes a base substrate, an insulating layer, a via hole and a first blockage pattern; wherein the insulating layer is arranged on the base substrate, the via hole runs through the insulating layer; and an orthographic projection of the first blockage pattern on the base substrate partially or entirely covers an orthographic projection of the via hole on the base substrate.

20 Claims, 1 Drawing Sheet

(58) Field of Classification Search
CPC ......... H01L 29/78633; H01L 29/66969; H01L 29/41733; H01L 29/66742; H01L 29/66765; G02F 1/136227; G02F 1/133512; G02F 1/13439; G02F 1/133514; G02F 1/133707; G02F 1/13627
See application file for complete search history.

(56) References Cited

U.S. PATENT DOCUMENTS

| | | | |
|---|---|---|---|
| 2008/0259051 A1* | 10/2008 | Ota | G06F 3/042 345/175 |
| 2014/0175445 A1 | 6/2014 | Cai et al. | |
| 2016/0187688 A1 | 6/2016 | Wen | |
| 2017/0160611 A1 | 6/2017 | Xu | |
| 2017/0357134 A1 | 12/2017 | Wang et al. | |

FOREIGN PATENT DOCUMENTS

| | | |
|---|---|---|
| CN | 104600079 A | 5/2015 |
| CN | 105336745 A | 2/2016 |
| CN | 105355630 A | 2/2016 |
| CN | 105679765 A | 6/2016 |
| CN | 106154669 A | 11/2016 |
| CN | 106200173 A | 12/2016 |
| CN | 107092124 A | 8/2017 |
| KR | 100392022 B1 | 7/2003 |

OTHER PUBLICATIONS

1st Chinese Office Action, English Translation.
CN106154669A, English Abstract and Machine Translation.
CN105355630A, English Abstract and U.S. Equivalent U.S. Pub. No. 2017/0357134.
CN103904086A, English Abstract and U.S. Equivalent U.S. Pub. No. 2014/0175445.
CN104600079A, English Abstract and U.S. Equivalent U.S. Pub. No. 2016/0187688.
International Search Report and Written Opinion for Application No. PCT/CN2017/116842, dated Mar. 23, 2018, 13 Pages.

* cited by examiner

ARRAY SUBSTRATE, METHOD FOR MANUFACTURING THE SAME, AND DISPLAY DEVICE

CROSS-REFERENCE TO RELATED APPLICATIONS

The present application is the U.S. national phase of PCT Application No. PCT/CN2017/116842 filed on Dec. 18, 2017, which claims priority to Chinese patent application No. 201710331020.0 filed on May 11, 2017, which are incorporated herein by reference in their entirety.

TECHNICAL FIELD

The present disclosure relates to the field of display technologies, and in particular to an array substrate, a method for manufacturing the same and a display device.

BACKGROUND

In a current array substrate, usually, an electrical connection between two film layer patterns, for example, a connection between a source-drain metal layer and an active layer, and a connection between the source-drain metal layer and a pixel electrode layer, is implemented by a via hole. Due to an influence by the via hole, compared with other flat positions, liquid crystal molecules in an area of the via hole are arranged irregularly, which affects a luminous consistency of a whole display panel. In order to avoid the influence by the via hole, it needs to block a light leak at the via hole.

In a related art, a black matrix is arranged at a position of an opposed substrate corresponding to the via hole, for blocking the light leak at the via hole on the array substrate. Based on the influence of an alignment accuracy of the array substrate and the opposed substrate, in order to entirely block the via hole, it tends to make the black matrix bigger than necessary in size, which affects an aperture ratio of the display panel, thereby adversely affecting display quality.

SUMMARY

In a first aspect, the present disclosure provides in some embodiments an array substrate, including a base substrate; an insulating layer; a via hole; and a blockage pattern, wherein the insulating layer is arranged on the base substrate, the via hole runs through the insulating layer; and an orthographic projection of the blockage pattern on the base substrate partially or entirely covers an orthographic projection of the via hole on the base substrate. The blockage pattern further includes a first blockage pattern, and an orthographic projection of the first blockage pattern on the base substrate is exactly the same as the orthographic projection of the via hole on the base substrate in terms of size, shape, and location.

Optionally, the orthographic projection of the via hole on the base substrate is completely superimposed with the orthographic projection of the first blockage pattern on the base substrate.

Optionally, the via hole and the first blockage pattern have regular shapes, and an orthographic projection of a center of the via hole on the base substrate is superimposed with an orthographic projection of a center of the first blockage pattern on the base substrate. Further, the via hole and the first blockage pattern are both circular or square.

Optionally, the array substrate further includes a source-drain metal layer, an active layer and a first insulating layer, wherein the first insulating layer is located between the source-drain metal layer and the active layer, and the insulating layer through which the via hole runs includes the first insulating layer. Further, the array substrate further includes a buffer layer, wherein the first blockage pattern is located on the base substrate, the buffer layer covers the first blockage pattern, and the active layer is located on the buffer layer.

Optionally, the array substrate further includes a source-drain metal layer, a first transparent electrode layer and a second insulating layer, wherein the second insulating layer is located between the source-drain metal layer and the first transparent electrode layer, and the insulating layer through which the via hole runs includes the second insulating layer. Further, the array substrate further includes a second transparent electrode layer, wherein the second insulating layer covers the second transparent electrode layer; and the first transparent electrode layer is a pixel electrode layer and the second transparent electrode layer is a common electrode layer, or the first transparent electrode layer is a common electrode layer and the second transparent electrode layer is a pixel electrode layer.

Optionally, the array substrate further includes a gate metal layer, a source-drain metal layer, and an active layer. The blockage pattern further includes a second blockage pattern, wherein the source-drain metal layer includes a source electrode and a drain electrode, the gate metal layer includes a gate electrode, the active layer includes a channel region which is located between the source electrode and the drain electrode and is superimposed with the gate electrode, an orthographic projection of the channel region on the base substrate is completely located in a region of an orthographic projection of the second blockage pattern on the base substrate, and the second blockage pattern is located on one side of the active layer close to the base substrate.

Optionally, the orthographic projection of the channel region on the base substrate is completely superimposed with the orthographic projection of the second blockage pattern on the base substrate.

Optionally, the first blockage pattern and the second blockage pattern are made of the same material and arranged in the same layer.

Optionally, a plurality of via holes runs through the insulating layer, the via holes corresponding to a plurality of independent first blockage patterns respectively, and the orthographic projections of the plural via holes on the base substrate are not superimposed one another.

Optionally, a plurality of via holes runs through the insulating layer, the via holes corresponding to one first blockage pattern, the via holes include a first via hole, the orthographic projections of the via holes out of the plurality of via holes, expect the first via hole, on the base substrate are all located in the orthographic projection of the first via hole on the base substrate, and the orthographic projection of the first via hole on the base substrate is completely located in the orthographic projection of the first blockage pattern on the base substrate.

In a second aspect, the present disclosure further provides a display device, including any one of the above-mentioned display panels.

Optionally, the display device further includes an opposed substrate, wherein the opposed substrate includes a base substrate and a black matrix, an orthographic projection of a region of the opposed substrate corresponding to the via hole on the base substrate of the opposed substrate is not superimposed with an orthographic projection of the black matrix on the base substrate of the opposed substrate.

In a third aspect, the present disclosure further provides a method for manufacturing the above-mentioned array substrate, including: providing a base substrate; forming a blockage pattern, an insulating layer and a via hole on the base substrate, wherein the via hole runs through the insulating layer, the orthographic projection of the blockage pattern on the base substrate partially or entirely covers the orthographic projection of the via hole on the base substrate. The blockage pattern further includes a first blockage pattern, and an orthographic projection of the first blockage pattern on the base substrate is exactly the same as the orthographic projection of the via hole on the base substrate in terms of size, shape, and location.

Optionally, the step of forming a first blockage pattern, an insulating layer and a via hole on the base substrate includes:

forming a first blockage pattern, an active layer, a via hole, a first insulating layer and a source-drain metal layer on the base substrate, wherein the via hole runs through the first insulating layer, and the orthographic projection of the via hole on the first insulating layer on the base substrate is completely located in the orthographic projection of the first blockage pattern on the base substrate.

Optionally, the step of forming a first blockage pattern, an insulating layer and a via hole on the base substrate includes:

forming a first blockage pattern, a source-drain metal layer, a second insulating layer, and a first transparent electrode layer on the base substrate, wherein the via hole runs through the second insulating layer, and the orthographic projection of the via hole on the second insulating layer on the base substrate is completely located in the orthographic projection of the first blockage pattern on the base substrate.

Optionally, the method further includes:

forming a second blockage pattern, an active layer, a gate metal layer and a source-drain metal layer on the base substrate, wherein the source-drain metal layer includes a source electrode and a drain electrode, the gate metal layer includes a gate electrode, the active layer includes a channel region which is located between the source electrode and the drain electrode and is superimposed with the gate electrode, an orthographic projection of the channel region on the base substrate is completely located in an orthographic projection of the second blockage pattern on the base substrate, and the second blockage pattern is located on one side of the active layer close to the base substrate.

Optionally, the first blockage pattern and the second blockage pattern are formed by a one-time (single) patterning process.

DETAILED DESCRIPTION

Figure 1:
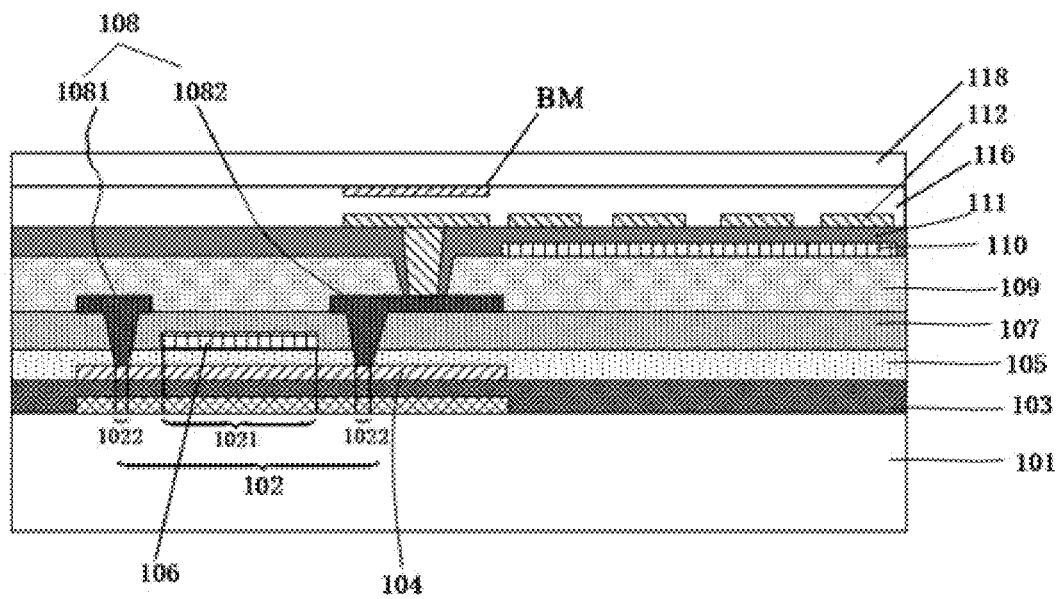
FIG. 1 is a structural schematic diagram of an array substrate according to some embodiments of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

One certain embodiment of the present disclosure provides an array substrate, including a base substrate and an insulating layer which is provided with a via hole and is arranged on the base substrate. The array substrate further includes: a blockage pattern, and the orthographic projection of the via hole on the base substrate is completely located in the orthographic projection of the blockage pattern on the base substrate. The blockage pattern further includes a first blockage pattern, and an orthographic projection of the first blockage pattern on the base substrate is exactly the same as the orthographic projection of the via hole on the base substrate in terms of size, shape, and location.

In the above embodiment of the present disclosure, the arrangement of the blockage pattern on the array substrate blocks the via hole on the insulating layer. Since the via hole and the blockage pattern are both arranged on the array substrate, the alignment accuracy is relatively high, without additionally increasing the size of the blockage pattern, which can ensure the blockage of the entire via hole, thereby improving the aperture ratio and further the display quality. In the above embodiment of the present disclosure, a deviation of the alignment accuracy of the blockage pattern and via hole may be up to about 1 µm, while in the related art, in the solution of arranging the black matrix on the opposed substrate to block the via hole, the deviation of the alignment accuracy is only up to 2-3 µm.

In the embodiment of the present disclosure, alternatively, the orthographic projection of the via hole on the base substrate is completely superimposed with the orthographic projection of the blockage pattern on the base substrate, thereby ensuring the aperture ratio to the maximum extent on basis of ensuring that the blockage pattern can entirely block the via hole.

Certainly, in some other embodiments of the present disclosure, it does not exclude the possibility that the blockage pattern has a size slightly greater than the via hole.

In some embodiments of the present disclosure, the array substrate further includes a source-drain metal layer, a first transparent electrode layer and a second insulating layer located between the source-drain metal layer and the first transparent electrode layer, and the insulating layer provided with the via hole includes a second insulating layer. That is, in embodiments of the present disclosure, the blockage pattern is arranged on the base substrate, and the blockage pattern may block the via hole on the second insulating layer.

The first transparent electrode layer is a pixel electrode layer, and the pixel electrode layer is connected with the source-drain metal layer through the via hole on the second insulating layer.

In some embodiments of the present disclosure, the array substrate further includes a source-drain metal layer, an active layer and a first insulating layer located between the source-drain metal layer and the active layer, and the insulating layer provided with the via hole includes a first insulating layer. That is, in the embodiments of the present disclosure, the blockage pattern is arranged on the base substrate, and the blockage pattern may block the via hole on the first insulating layer. The source-drain metal layer is connected with the active layer through the via hole on the first insulating layer.

Certainly, in some other embodiments of the present disclosure, the insulating layer provided with the via hole may include the above-mentioned first insulating layer and the second insulating layer at the same time, that is, the blockage pattern is arranged on the base substrate, and the blockage pattern may block the via holes on the first insulating layer and the second insulating layer.

In some embodiments of the present disclosure, the array substrate further includes a gate metal layer, a source-drain metal layer, and an active layer. The blockage pattern further includes a second blockage pattern, wherein the source-drain metal layer includes a source electrode and a drain electrode, the gate metal layer includes a gate electrode, the active layer includes a channel region which is located between the source electrode and the drain electrode and is superimposed with the gate electrode, an orthographic projection of the channel region on the base substrate is completely located in a region of an orthographic projection of the second blockage pattern on the base substrate, and the second blockage pattern is located on one side of the active layer close to the base substrate. The second blockage pattern may block rays of light emitted from a backlight module towards the channel region of the active layer, so as to prevent the performance from being affected due to the influence of the rays of light on the channel region of the active layer.

Alternatively, the orthographic projection of the channel region on the base substrate is completely superimposed with the orthographic projection of the second blockage pattern on the base substrate, thereby ensuring the aperture ratio to the maximum extent on basis of ensuring that the channel region is blocked.

Further alternatively, the orthographic projection of the active layer on the base substrate is located in the orthographic projection of the second blockage pattern on the base substrate, thereby entirely blocking the rays of light emitted from the backlight module towards the active layer.

In one alternative embodiment of the present disclosure, the first blockage pattern and the second blockage pattern are made of the same material and arranged in the same layer, thereby being formed by the one-time patterning process, and saving manufacturing costs.

In addition, the first blockage pattern may be connected with the second blockage pattern, which facilitates the fabrication.

The embodiment of the present disclosure further provides a display device, including the above-mentioned array substrate.

The display device may be a display panel, or a display device including the display panel and a driving circuit.

Optionally, the display device further includes an opposed substrate which has a base substrate and a black matrix, an orthographic projection of a region of the opposed substrate corresponding to the via hole on the base substrate of the opposed substrate is not superimposed with an orthographic projection of the black matrix on the base substrate of the opposed substrate. That is, since the via hole on the insulating layer on the array substrate is blocked by the first blockage pattern, the black matrix may not be arranged at the position of the opposed substrate corresponding to the via hole. Based on the same inventive concept, another embodiment of the present disclosure further provides a method for manufacturing an array substrate, including:

providing a base substrate;

forming a blockage pattern and an insulating layer with a via hole on the base substrate, the orthographic projection of the via hole on the base substrate being completely located in the orthographic projection of the blockage pattern on the base substrate. Specifically the blockage pattern further includes a first blockage pattern, and an orthographic projection of the first blockage pattern on the base substrate is exactly the same as the orthographic projection of the via hole on the base substrate in terms of size, shape, and location.

Alternatively, the orthographic projection of the via hole on the base substrate is completely superimposed with the orthographic projection of the blockage pattern on the base substrate, thereby ensuring the aperture ratio to the maximum extent on basis of ensuring that the first blockage pattern can entirely block the via hole.

In some embodiments of the present disclosure, the step of forming a first blockage pattern and an insulating layer with a via hole on the base substrate includes:

forming a first blockage pattern, a source-drain metal layer, a second insulating layer, and a first transparent electrode layer on the base substrate, wherein the via hole is formed on the second insulating layer, and the orthographic projection of the via hole on the second insulating layer on the base substrate is completely located in the orthographic projection of the first blockage pattern on the base substrate.

In some embodiments of the present disclosure, the step of forming a first blockage pattern and an insulating layer with a via hole on the base substrate includes:

forming a first blockage pattern, an active layer, a first insulating layer and a source-drain metal layer on the base substrate, wherein the via hole is formed on the first insulating layer, and the orthographic projection of the via hole on the first insulating layer on the base substrate is completely located in the orthographic projection of the first blockage pattern on the base substrate.

In some embodiments of the present disclosure, the step of forming a first blockage pattern and an insulating layer with a via hole on the base substrate includes:

forming a second blockage pattern, an active layer, a gate metal layer and a source-drain metal layer on the base substrate, wherein the source-drain metal layer includes a source electrode and a drain electrode, the gate metal layer includes a gate electrode, the active layer includes a channel region which is located between the source electrode and the drain electrode and is superimposed with the gate electrode, an orthographic projection of the channel region on the base substrate is completely located in an orthographic projection of the second blockage pattern on the base substrate, and the second blockage pattern is located on one side of the active layer close to the base substrate.

The second blockage pattern can block rays of light emitted from a backlight module towards the channel region of the active layer, so as to prevent the performance from being affected due to the influence of the rays of light on the channel region of the active layer.

Alternatively, the orthographic projection of the channel region on the base substrate is completely superimposed with the orthographic projection of the second blockage pattern on the base substrate, thereby ensuring the aperture ratio to the maximum extent on basis of ensuring the blockage of the channel region.

Alternatively, the first blockage pattern and the second blockage pattern are formed by the one-time patterning process, thereby saving the manufacturing costs.

In addition, the first blockage pattern may be connected with the second blockage pattern, which facilitates the fabrication.

In the above-mentioned embodiments, the first blockage pattern may be made of a metal material. Certainly, the first blockage pattern may be also made of other opaque materials.

Alike, the second blockage pattern may be made of a metal material. Certainly, the second blockage pattern may be also made of other opaque materials.

In the above-mentioned embodiments, the via hole may be circular or square.

Alternatively, the first blockage pattern has a shape the same as the via hole.

Alternatively, the orthographic projection of the center of the via hole on the base substrate is superimposed with that of the center of the first blockage pattern on the base substrate.

Further, alternatively, the orthographic projection of the via hole on the base substrate is completely superimposed with the orthographic projection of the first blockage pattern on the base substrate, i.e., the via hole has the same size and shape as the corresponding first blockage pattern, and is centrally symmetrical, thereby ensuring the aperture ratio to the maximum extent.

In one alternative embodiment of the present disclosure, the method for manufacturing an array substrate includes:

providing a base substrate;

forming a blockage pattern on the base substrate;

forming a buffer layer covering the blockage pattern;

forming an active layer on the buffer layer;

forming a gate insulating layer covering the active layer;

forming a gate metal layer on the gate insulating layer;

forming a first insulating layer covering the gate metal layer, and forming a via hole running through the first insulating layer and the gate insulating layer, the orthographic projection of the via hole on the base substrate being completely located in the orthographic projection of the blockage pattern on the base substrate, wherein the blockage pattern further comprises a first blockage pattern, and an orthographic projection of the first blockage pattern on the base substrate is exactly the same as the orthographic projection of the via hole on the base substrate in terms of size, shape, and location;

forming a source-drain metal layer on the first insulating layer, the source-drain metal layer including a source electrode and a drain electrode which are connected with the active layer through the via hole.

In one embodiment, the method may further include:

forming a second insulating layer covering the source-drain metal layer;

forming a via hole running through the second insulating layer, the orthographic projection of the via hole running through the second insulating layer on the base substrate being completely located in the orthographic projection of the first blockage pattern on the base substrate;

forming a first transparent electrode layer which is connected with the source-drain metal layer through the via hole running through the second insulating layer.

In another embodiment, the method may further include:

forming a third insulating layer covering the source-drain metal layer, and forming a via hole running through the third insulating layer, the orthographic projection of the via hole running through the third insulating layer on the base substrate being completely located in the orthographic projection of the first blockage pattern on the base substrate;

forming a second transparent electrode layer;

forming a second insulating layer covering the second transparent electrode layer, and forming a via hole running through the second insulating layer, the via hole running through the second insulating layer being located in the via hole running through the third insulating layer;

forming a first transparent electrode layer which is connected with the source-drain metal layer through the via hole running through the second insulating layer.

Hereinafter, the structure of the array substrate in the embodiment of the present disclosure will be explained in detail in combination with embodiments.

Figure 2:
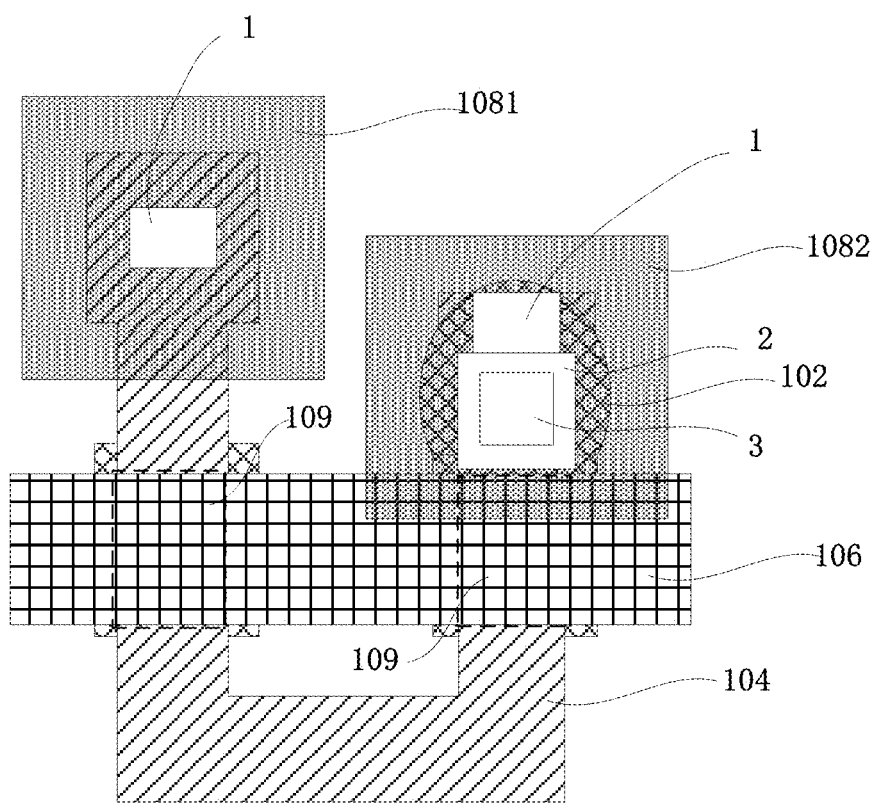
FIG. 2 is a top view of a structure of a via hole region of the array substrate shown in FIG. 1.

With reference to FIGS. 1 and 2, FIG. 1 is a structural schematic diagram of an array substrate according to some embodiments of the present disclosure, and FIG. 2 is a top view of a structure of a via hole region of the array substrate. The array substrate includes: a base substrate 101, a blockage pattern 102, a buffer layer 103, an active layer 104, a gate insulating layer 105, a gate metal layer 106, a first insulating layer 107, a source-drain metal layer 108, a third insulating layer 109, a common electrode layer 110, a second insulating layer 111 and a pixel electrode layer 112. The gate metal layer 106 includes a gate electrode, and the source-drain metal layer 108 includes a source electrode 1081 and a drain electrode 1082. Furthermore, as shown in FIG. 1, the array substrate further includes an opposed substrate 118 and intermediate substrate 116. And the opposed substrate 118 includes a base substrate and a black matrix BM disposed on the base substrate, an orthographic projection of a region of the opposed substrate 118 corresponding to the via hole on the base substrate of the opposed substrate 118 is not superimposed with an orthographic projection of the black matrix BM on the base substrate of the opposed substrate 118. Optionally, this array substrate may be the one in a technical mode of Advanced-Super Dimensional Switching, simply referred to as "AD-SDS".

In the embodiments of the present disclosure, as shown in FIG. 1, the blockage pattern 102 includes the first blockage pattern 1022 and the second blockage pattern 1021 in the above-mentioned embodiment, for blocking the via hole 1 running through the first insulating layer 107 and the gate insulating layer 105, the via hole 2 on the third insulating layer 109, and the via hole 3 on the second insulating layer 111. The via hole 1 is configured to connect the source-drain metal layer 108 with the active layer 104, and the via hole 3 is configured to connect the pixel electrode layer 112 with the source-drain metal layer 108. Since in the embodiments of the present disclosure, the via hole 2 is greater than the via hole 3, and the via hole 3 is located in the via hole 2, the blockage pattern 102 may block the via hole 3 as long as it blocks the via hole 2. As an alternative, as shown in FIG. 1, an orthographic projection of the first blockage pattern 1022 on the base substrate 101 is exactly the same as the orthographic projection of the via hole 3 on the base substrate 101 in terms of size, shape, and location.

In the embodiments of the present disclosure, the active layer includes a channel region (the region 109 as shown in FIG. 2) which is located between the source electrode 1081 and the drain electrode 1082 and is superimposed with the gate electrode, and the second blockage pattern 1021 of the blockage pattern 102 is further configured to block the channel region of the active layer 104, which avoids the influence of the back light on the channel region of the active layer 104.

In some embodiments, the blockage pattern may be arranged above the base substrate and below the active layer. In the embodiments, the blockage pattern 102 is located above the base substrate 101, the buffer layer 103 covers this blockage pattern 102, and the active layer 104 is arranged above the buffer layer 103. In some embodiments, the blockage pattern may be arranged on one side of the via hole or the channel region close to the backlight module.

It should be noted that the corresponding blockage pattern may be arranged on the base substrate for one via hole of the array substrate, or a plurality of independent blockage patterns may be arranged for a plurality of via holes respectively, or one blockage pattern may be arranged for a plurality of via holes (for example, the above-mentioned via holes 2 and 3), which is not limited in the embodiment of the present disclosure.

The array substrate in the above-mentioned embodiment is a top-gate-type array substrate. Certainly, in some other embodiments of the present disclosure, the array substrate may be also a bottom-gate-type array substrate.

In the array substrate of the above-mentioned embodiment, the common electrode layer 110 and the pixel electrode layer 112 may be interchanged in terms of position.

Unless otherwise defined, any technical or scientific term used in the present disclosure shall have the common meaning understood by a person of ordinary skills. Such words as "first" and "second" used in the present disclosure are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The above descriptions are merely preferable embodiments of the present disclosure, it should be noted that several improvements and modifications may be made for a person skilled in the art without departing from the principle of the present disclosure, and also should be considered to fall within the protection scope of the present disclosure.

What is claimed is:

1. A display device, comprising an array substrate, the array substrate comprising a base substrate, an insulating layer, a via hole and a blockage pattern;
   wherein the insulating layer is arranged on the base substrate, the via hole runs through the insulating layer; and an orthographic projection of the blockage pattern on the base substrate partially or entirely covers an orthographic projection of the via hole on the base substrate; and
   wherein the blockage pattern comprises a first blockage pattern, and an orthographic projection of the first blockage pattern on the base substrate is exactly the same as the orthographic projection of the via hole on the base substrate in terms of size, shape, and location.

2. The display device according to claim 1, wherein the orthographic projection of the via hole on the base substrate is completely superimposed with the orthographic projection of the first blockage pattern on the base substrate.

3. The display device according to claim 1, further comprising an opposed substrate,
   wherein the opposed substrate comprises a base substrate and a black matrix, an orthographic projection of a region of the opposed substrate corresponding to the via hole on the base substrate of the opposed substrate is not superimposed with an orthographic projection of the black matrix on the base substrate of the opposed substrate.

4. The display device according to claim 1, wherein the array substrate further comprises: a source-drain metal layer, an active layer and a first insulating layer,
   wherein the first insulating layer is located between the source-drain metal layer and the active layer, and the insulating layer through which the via hole runs comprises the first insulating layer.

5. The display device according to claim 1, wherein the array substrate further comprises: a source-drain metal layer, a first transparent electrode layer and a second insulating layer,
   wherein the second insulating layer is located between the source-drain metal layer and the first transparent electrode layer, and the insulating layer through which the via hole runs comprises the second insulating layer.

6. The display device according to claim 5, wherein the array substrate further comprises: a second transparent electrode layer,
   wherein the second insulating layer covers the second transparent electrode layer; and
   the first transparent electrode layer is a pixel electrode layer and the second transparent electrode layer is a common electrode layer, or the first transparent electrode layer is a common electrode layer and the second transparent electrode layer is a pixel electrode layer.

7. The display device according to claim 1, wherein the array substrate further comprises: a gate metal layer, a source-drain metal layer, and an active layer;
   wherein the blockage pattern further comprises a second blockage pattern; and
   wherein the source-drain metal layer comprises a source electrode and a drain electrode, the gate metal layer comprises a gate electrode, the active layer comprises a channel region which is located between the source electrode and the drain electrode and is superimposed with the gate electrode, an orthographic projection of the channel region on the base substrate is completely located in a region of an orthographic projection of the second blockage pattern on the base substrate, and the second blockage pattern is located on one side of the active layer close to the base substrate.

8. The display device according to claim 7, wherein the orthographic projection of the channel region on the base substrate is completely superimposed with the orthographic projection of the second blockage pattern on the base substrate.

9. An array substrate, comprising:
   a base substrate;
   an insulating layer;
   a via hole; and
   a blockage pattern,
   wherein the insulating layer is arranged on the base substrate, the via hole runs through the insulating layer;
   wherein an orthographic projection of the blockage pattern on the base substrate partially or entirely covers an orthographic projection of the via hole on the base substrate; and
   wherein the blockage pattern comprises a first blockage pattern, and an orthographic projection of the first blockage pattern on the base substrate is exactly the same as the orthographic projection of the via hole on the base substrate in terms of size, shape, and location.

10. The array substrate according to claim 9, wherein the orthographic projection of the via hole on the base substrate is completely superimposed with the orthographic projection of the first blockage pattern on the base substrate.

11. The array substrate according to claim 9, wherein the via hole and the first blockage pattern have regular shapes, and an orthographic projection of a center of the via hole on the base substrate is superimposed with an orthographic projection of a center of the first blockage pattern on the base substrate.

12. The array substrate according to claim 9, wherein
a plurality of via holes runs through the insulating layer, the via holes corresponding to a plurality of independent first blockage patterns respectively, respective orthographic projections of the plurality of via holes on the base substrate are not superimposed with one another; or
a plurality of via holes runs through the insulating layer, the via holes corresponding to one first blockage pattern, the via holes comprise a first via hole, the orthographic projections of the via holes out of the plurality of via holes, expect the first via hole, on the base substrate are all located in the orthographic projection of the first via hole on the base substrate, and the orthographic projection of the first via hole on the base substrate is completely located in the orthographic projection of the first blockage pattern on the base substrate.

13. The array substrate according to claim 9, further comprising: a source-drain metal layer, an active layer and a first insulating layer, wherein the first insulating layer is located between the source-drain metal layer and the active layer, and the insulating layer through which the via hole runs comprises the first insulating layer.

14. The array substrate according to claim 13, further comprising a buffer layer, wherein the first blockage pattern is located on the base substrate, the buffer layer covers the first blockage pattern, and the active layer is located on the buffer layer.

15. The array substrate according to claim 9, further comprising:
a source-drain metal layer, a first transparent electrode layer and a second insulating layer,
wherein the second insulating layer is located between the source-drain metal layer and the first transparent electrode layer, and the insulating layer through which the via hole runs comprises the second insulating layer.

16. The array substrate according to claim 15, further comprising:
a second transparent electrode layer,
wherein the second insulating layer covers the second transparent electrode layer; and
the first transparent electrode layer is a pixel electrode layer and the second transparent electrode layer is a common electrode layer, or the first transparent electrode layer is a common electrode layer and the second transparent electrode layer is a pixel electrode layer.

17. The array substrate according to claim 9, further comprising:
a gate metal layer, a source-drain metal layer, and an active layer;
wherein the blockage pattern further comprises a second blockage pattern,
wherein the source-drain metal layer comprises a source electrode and a drain electrode, the gate metal layer comprises a gate electrode, the active layer comprises a channel region which is located between the source electrode and the drain electrode and is superimposed with the gate electrode, an orthographic projection of the channel region on the base substrate is completely located in a region of an orthographic projection of the second blockage pattern on the base substrate, and the second blockage pattern is located on one side of the active layer close to the base substrate.

18. The array substrate according to claim 17, wherein an orthographic projection of the channel region on the base substrate is completely superimposed with an orthographic projection of the second blockage pattern on the base substrate.

19. The array substrate according to claim 17, wherein the first blockage pattern and the second blockage pattern are made of the same material and arranged in the same layer.

20. A method for manufacturing an array substrate, comprising:
providing a base substrate;
forming a blockage pattern, an insulating layer and a via hole on the base substrate, wherein the via hole runs through the insulating layer, the orthographic projection of the blockage pattern on the base substrate partially or entirely covers the orthographic projection of the via hole on the base substrate,
wherein the blockage pattern comprises a first blockage pattern, and an orthographic projection of the first blockage pattern on the base substrate is exactly the same as the orthographic projection of the via hole on the base substrate in terms of size, shape, and location.

* * * * *